(12) United States Patent
Skidmore et al.

(10) Patent No.: US 6,879,016 B1
(45) Date of Patent: Apr. 12, 2005

(54) MICROCOMPONENT HAVING INTRA-LAYER ELECTRICAL ISOLATION WITH MECHANICAL ROBUSTNESS

(75) Inventors: George D. Skidmore, Plano, TX (US); Aaron Geisberger, Plano, TX (US); Matthew D. Ellis, Allen, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/266,726

(22) Filed: Oct. 7, 2002

(51) Int. Cl.[7] .................... H01L 29/00; H01L 29/06
(52) U.S. Cl. ................ 257/499; 257/622; 257/623
(58) Field of Search ................ 257/499, 622, 257/623

(56) References Cited

U.S. PATENT DOCUMENTS

| | | | |
|---|---|---|---|
| 5,811,315 A | | 9/1998 | Yindeepol et al. |
| 5,846,849 A | * | 12/1998 | Shaw et al. .......... 438/52 |
| 6,051,866 A | * | 4/2000 | Shaw et al. .......... 257/417 |
| 6,121,552 A | | 9/2000 | Brosnihan et al. |
| 6,239,473 B1 | | 5/2001 | Adams et al. |
| 6,291,875 B1 | | 9/2001 | Clark et al. |
| 6,428,713 B1 | * | 8/2002 | Christenson et al. ...... 216/2 |
| 6,573,154 B1 | * | 6/2003 | Sridhar et al. .......... 438/430 |

OTHER PUBLICATIONS

Zhang, Dacheng et al., "A novel isolation technology in bulk micromachining using deep reactive ion etching and a polysilicon refill", Journal of J. Micromech. Microeng. vol. 11 (2001—pp. 13–19.

Muller, Lilac et al., "Electrical Isolation Process for Molded, High–Aspect–Ratio Polysilicon Microstructures", Dept. of Mechanical Engineering, Univeristy of California at Berkeley, 6 pages.

Ayazi, Farrokh, et al., Journal of J. Microelectromechanical Systems, vol. 9, No. 3, (Sep. 2000), pp. 288–294.

Forsberg, M., et al., "Shallow and Deep Trench Isolation for use in RF–Bioplar IC:s", Applied Materials, 4 pages.

* cited by examiner

*Primary Examiner*—Eddie Lee
*Assistant Examiner*—Samuel A Gerbremariam
(74) *Attorney, Agent, or Firm*—Haynes and Boone, LLP

(57) ABSTRACT

A system and method is disclosed that strengthens the structural integrity of trench-fill electrical isolation techniques. One embodiment provides for etching a series of interlocking geometric trenches into a device layer and filling the trenches with a non-conductive dielectric material. The dielectric material establishes electrical isolation while the interlocking geometric trenches strengthen the structural integrity of the separation by providing at least one surface on the interlocking separation that experiences a compression force for each direction that the electrically isolated MEMS component is moved.

11 Claims, 3 Drawing Sheets

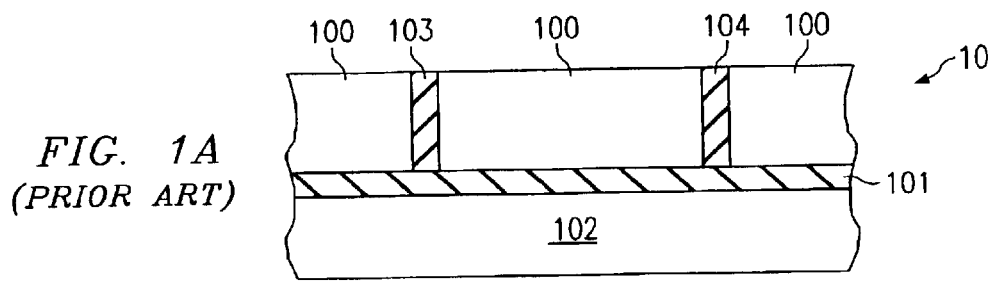
FIG. 1A
(PRIOR ART)
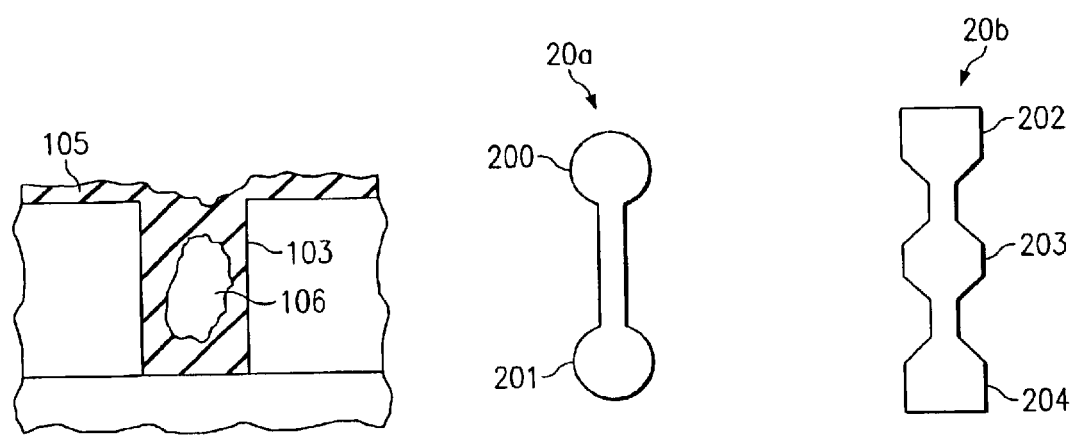
FIG. 1B
(PRIOR ART)
FIG. 2A
(PRIOR ART)
FIG. 2B
(PRIOR ART)
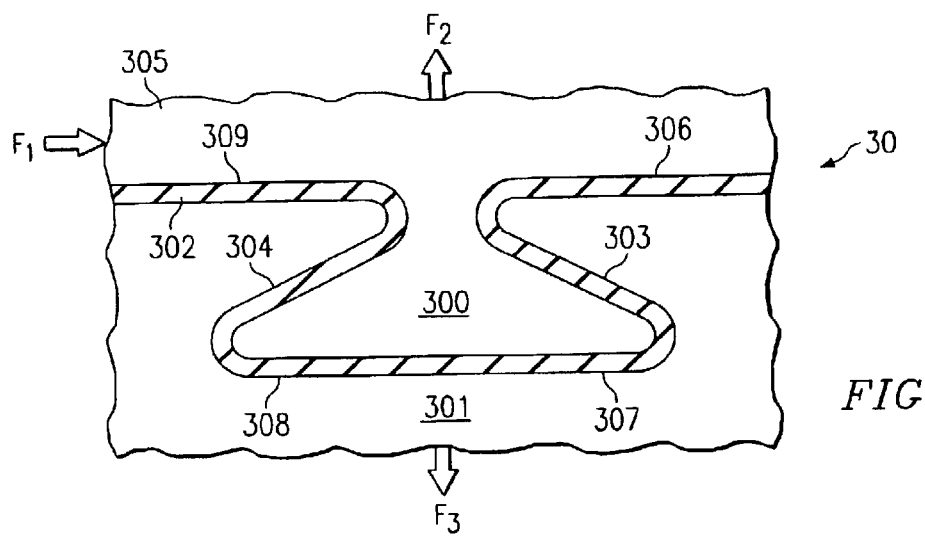
FIG. 3

MICROCOMPONENT HAVING INTRA-LAYER ELECTRICAL ISOLATION WITH MECHANICAL ROBUSTNESS

CROSS-REFERENCE TO RELATED APPLICATIONS

This application is related to concurrently filed and commonly assigned U.S. Patent Application Ser. No. 10/266,724 entitled "PROCESS FOR FABRICATING MICROCOMPONENTS THAT ENABLE ELECTRICAL ISOLATION," the disclosure of which is hereby incorporated herein by reference.

GOVERNMENT INTERESTS

The invention was made with Governmental support under Contract 70NANBIH3021 awarded by the National Institute for Standards Technology (NIST), Grants and Agreements Management Division, 100 Bureau Drive, MAIL STOP 3580, Building 411, Room A143, Gaithersburg, Md. 20899-3580. The Government has certain rights in the invention.

TECHNICAL FIELD

The present application relates in general to sub-millimeter devices, and more particularly, to a system and method for fabricating mechanically sound Microelectromechanical systems (MEMS) components having electrical isolation properties.

BACKGROUND OF THE INVENTION

MEMS combine micro-scaled mechanical and electrical components into integrated systems. MEMS are typically used as microsensors, microactuators, and the like, and have found beneficial use for implementing accelerometers and other such inertial instruments. MEMS may also be used in chemical detectors, pressure sensors, thermal and/or electrostatic actuators, and the like. The use and applicability of such devices is only increasing as the intelligence and complexity of the MEMS increases, at the same time that the overall scale of the devices is decreasing into the nano-scaled, nanoelectromechanical systems (NEMS).

Many sub-millimeter MEMS/NEMS utilize capacitive connections or operations to implement the sensing or actuating functions. Moreover, many MEMS/NEMS use thermal energy for operation, which may require running electrical current across such MEMS/NEMS elements. The electronic circuitry for all types of these devices continues to increase. Therefore, in order to maintain the functionality of the capacitive elements, thermal elements, and the overall growing embedded electronics, it is desirable to create MEMS/NEMS devices with electrical isolation properties. With the bulk of current technology settled mostly into the sub-millimeter MEMS region, techniques have been developed for fabricating micro-scaled devices with electrical isolation elements.

One such method, disclosed in U.S. Pat. No. 6,291,875, issued to Clark et al., entails etching a trench to physically separate the conductive material on the device and then filling that trench with an insulating material in order to re-attach the two portions. Thus, the electrical isolation is generally created by cutting the conductive connection and then mending the cut with an electrically isolating substance. With the insulating layer added, the device is again mechanically connected allowing the micromechanical aspect of the MEMS device to continue.

One problem associated with the trench-fill method for electrically isolating MEMS devices, are the cavities or voids that are typically formed in the insulating material filling the trench. The material used for the insulating layer typically does not uniformly fill the trenches. The unevenness may generally cause the upper portion of the trench to close before the lower portion of the trench is completely filled. This creates gaps or voids within the trench that can sometimes weaken the structural integrity of the device and can lessen the thermal conductivity, which is essential for reliable operation of some devices, such as thermal actuators.

The Clark, et al., patent discusses this problem and is directed to a method for improving the trench-fill by adding condyles to the trenches. Condyles are generally openings or "knuckles" at the trench ends that are typically wider than the basic trench width to allow the insulating material to more easily fill the trench more before closing off. Thus, the Clark patent requires etching trench patterns to attempt to alleviate the problems caused by the voids or cavities typically formed in regularly shaped trench-fills.

The addition of the condyles in the Clark patent does not guarantee that voids or cavities will not form. The increased opening areas likely improve the fill of the insulating material, but because of the non-uniformity and lack of precise control over the fill process, voids or cavities could still form for the same reasons. Therefore, while Clark describes an improvement to the trench-fill isolation methods, it does not guarantee success.

Outside of the electrical isolation techniques, mechanical connectors have been fabricated by etching male and female connection ends onto MEMS devices that are intended to connect. In such mechanical elements, the first MEMS device is etched with the female/receptacle end, and the second MEMS device is etched with the male/protruding end. As the two ends are inserted together, flanges or extruding portions of the male part deflect and then rebound when fully inserted. Thus, the two parts are frictionally maintained connected. These technologies have not been used with electrical isolation and would likely not be available for accepting dielectric materials or other non-conducting materials within the connection region.

BRIEF SUMMARY OF THE INVENTION

The present invention is directed to a system and method that strengthens the structural integrity of trench-fill electrical isolation techniques. One embodiment of the present invention provides for preferably etching an interlocking geometric trench into a device layer and filling the trench with a non-conductive dielectric material. The trench and dielectric material establish electrical isolation while the interlocking geometry preferably strengthens the structural integrity of the separation by providing at least one surface on the interlocking separation that experiences a compression force for practically any direction that the electrically isolated MEMS component is moved.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1A is a cross-sectional view of a prior art silicon on insulator wafer with trench-fill electrical isolation;

Figure 4A:
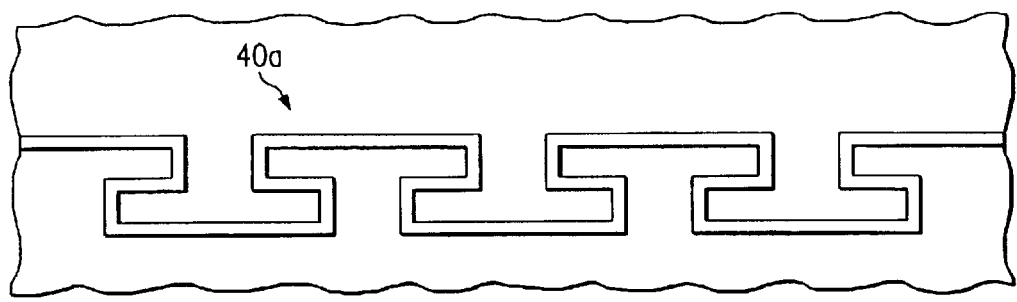
Figure 4B:
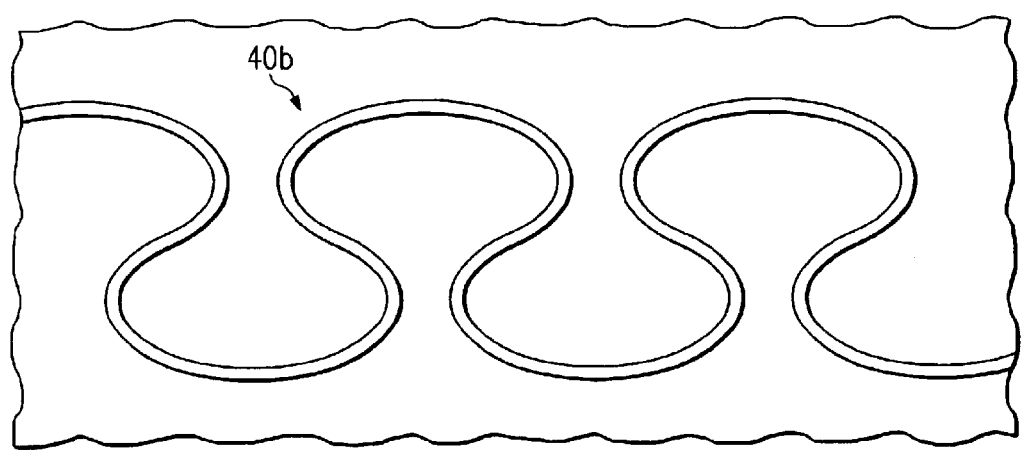
Figure 4C:
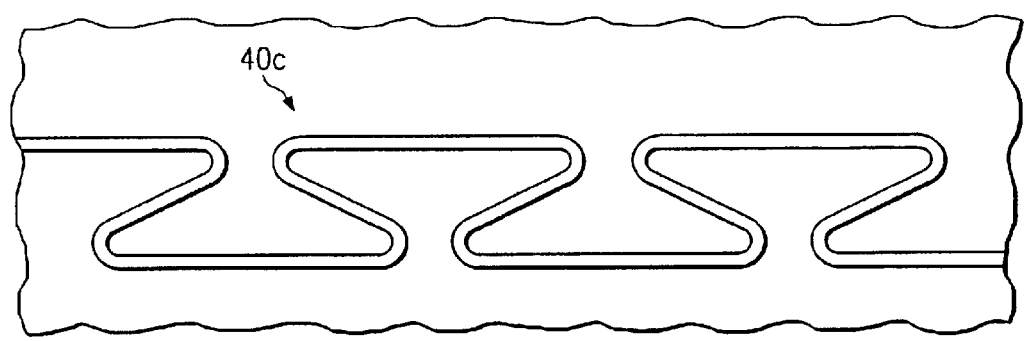
Figure 5A:
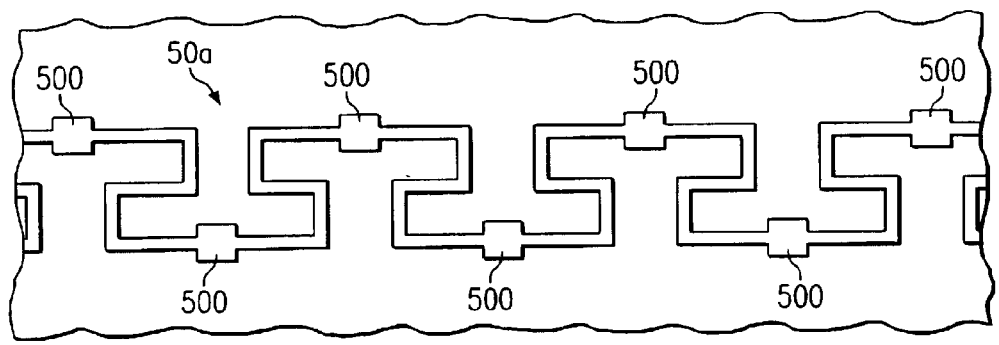
Figure 5B:
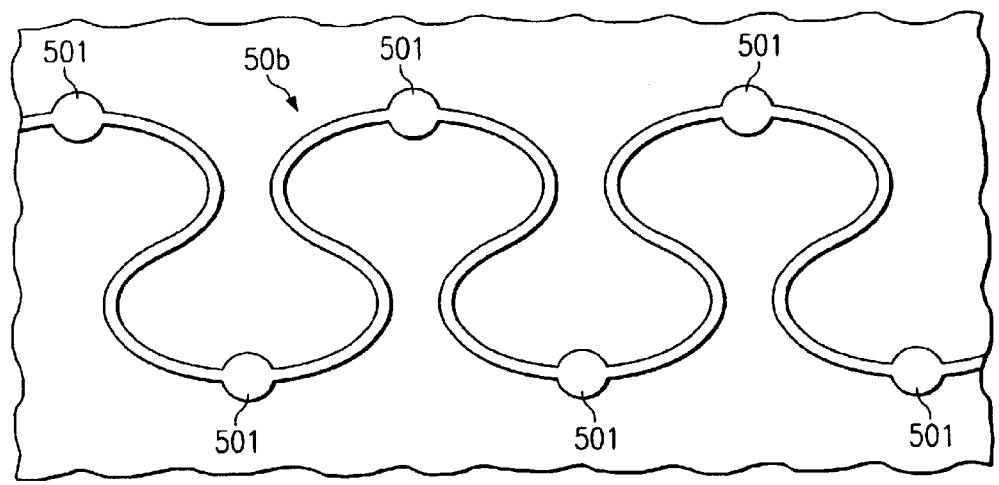
Figure 5C:
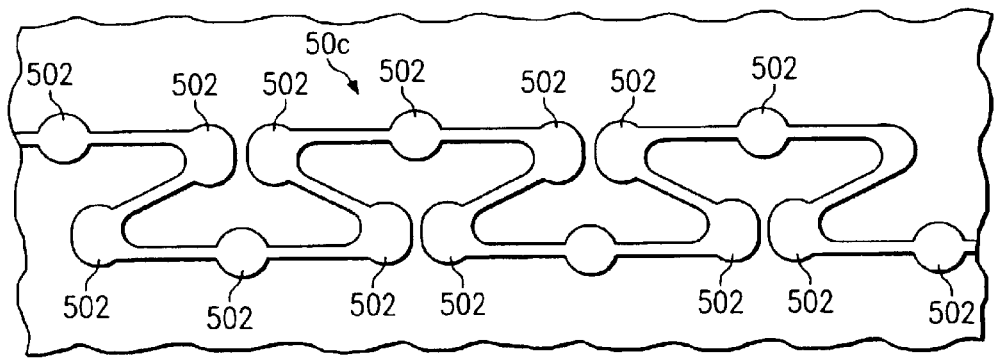

FIG. IB is a close-up cross-sectional view of the prior art silicon on insulator wafer illustrated in FIG. 1A;

FIGS. 2A–2B are top views of prior art trenches configured with additional condyles;

FIG. 3 is a close-up top view of a trench-fill joint configured according to the teachings of the present invention;

FIGS. 4A–4C are exemplary top views of trench-fill joints configured according to multiple embodiments of the present invention; and FIGS. 5A–5C are exemplary top views of trench-fill joints configured according to multiple embodiments of the present invention supplemented with condyles.

DETAILED DESCRIPTION OF THE INVENTION

FIGS. 1 and 2 illustrate the prior art systems for establishing MEMS devices having electrical isolation properties. FIG. 1A shows silicon on insulator (SOI) wafer 10. SOI wafer 10 includes single crystal silicon (SCS) layer 100, buried oxide (BOx) layer 101, and handle silicon layer 102. In order to establish or provide electrical isolation, channels or trenches are etched through SCS layer 100 and then filled with a dielectric or other non-conducting material. These electrical isolation trench-fills are illustrated in FIG. 1A elements 103 and 104. The MEMS device is then preferably released by removing box layer 101, thus, releasing SCS layer 100 from handle silicon layer 102.

One of the major problems with the prior art trench-fill method of establishing electrical isolation are the voids or gaps which often times occur during the trench-fill process. FIG. 1B illustrates a close-up view of trench-fill 103 depicted in FIG. 1A. During the trench-fill process, dielectric material that is layered into the etched trench will begin to fill the trench. However, because of the unevenness and non-uniformity of the dielectric material, the top side of the trench has a tendency to join and close before filling the entire trench with dielectric material. Void 106 is shown within trench-fill 103 as dielectric material 105 is layered onto the silicon wafer. Because the dielectric material has not solidly filled the trench, there is an inherent weakness in the structural integrity of the MEMS device. As forces are exerted on the MEMS device, the dielectric material holding the sections of the device together will be placed under repeated sheer, tensile, torque, and compression stresses. Because void 106 is within the trench, there is not very much dielectric material maintaining the structural integrity of the MEMS device. Thus, at some point, as stresses are being exerted on the MEMS device, failure is likely to occur.

The technology described in the Clark patent was addressed to improving the fills of the trench-fill methods. Instead of etching straight trenches through a silicon layer, the Clark patent provides for adding condyles at selected points along the trench. FIG. 2 illustrates two examples of the modified trenches with the condyles as described and disclosed in the Clark patent. Trench 20*a* illustrates a single trench cut with two condyles, 200 and 201, disposed at the ends of the trench. Trench 20*b* illustrates a modified trench which includes three condyles, 202, 203, and 204. The function of the condyles is to allow more of the dielectric fill materials to fill the trench. Whereas the narrow straights of the trenches may still have the top part of the trench close off before the entire trench is filled, the larger openings of the condyles or nubbins allow more of the dielectric material to flow into the trench, including to the voids that may have formed in the narrow trench areas. While the condyles of the Clark patent have improved the integrity of the trench-fill method in some circumstances, the condyles themselves are not a guarantee that voids will not occur.

Turniing now to FIG. 3, FIG. 3 illustrates a close-up view of a modified trench-fill configured according to one embodiment of the present invention. Trench joint 30 is a close-up view of an etched joint connection within a MEMS device. Instead of etching a straight trench, or a straight trench with a condyle, an embodiment of the present invention provides for preferably etching a trench into a shape that results in an interlocking geometry, as shown in FIG. 3. The resulting trenched joint produces male part 300 and female part 301. Pieces 300 and 301 preferably fit together into a joint much like a dove-tail joint in carpentry. However, instead of individually cutting the dove-tail joints as in carpentry, the dove-tail appearance of the joint is preferably etched straight into the silicon substrate. After the etching trench-joint 30, the gap between parts 300 and 301 forms an electrical isolation between the two pieces. A dielectric material is then preferably layered within trench-joint 30 which will then hold parts 300 and 301 together in a permanent fashion. Dielectric layer 302 then permanently joins parts 300 and 301 together.

One of the important features of the embodiment of the present invention illustrated in FIG. 3 is the interlocking geometric shape formed by trench-joint 30. Because of its geometry, there should preferably be at least one section of the joint that experiences compression pressure when the MEMS device is effected by an external force. With the prior art methods of the straight trench, or the straight trench with the condyles, there will typically be at least a tensile force exerted on the entire dielectric material, unless the two sides are being directly pushed together. It is generally well known that dielectric fill material is stronger in a compression force than a tensile force. Thus, if too much tensile force is applied to the dielectric material, failure will likely occur. However, if a compression force is applied to the dielectric fill material, the likelihood of failure has been substantially reduced. As illustrated in FIG. 3, if a perpendicular force, F1, is applied at 305, compression forces preferably exist in trench-joint 30 at area 303. Because force is being applied at 305, areas 304 will experience tensile forces, while areas 306–309 experience tensile/sheer forces. With the element of compression forces, trench-joint 30 will preferably be more structurally sound than a typical straight trench or a typical straight trench with condyles included. In a similar example, if parts 300 and 301 are being pulled apart by forces, F2 and F3, compression forces will preferably be experienced at areas 303 and 304, thus, counteracting the tensile forces seen at areas 306, 307, 308, and 309.

The interlockihg geometric shape depicted in trench joint 30 of FIG. 3 is not the only interlocking design that can be utilized for an embodiment of the present invention. FIG. 4 illustrates three separate designs of interlocking geometric trench-joints that may be implemented according to the present invention. Each of trench-joints 40a, 40b, and 40c comprise interlocking geometric designs which, when etched and trench-filled into a silicon substrate, will preferably exhibit the favorable compression-tensile strength ratio of trench-joint 30 illustrated in FIG. 3. Thus, regardless of the direction from which a force is applied on a particular MEMS device, if the MEMS device includes an electrical isolation trench-fill in the form of a trench-joint configured according to one or more of the embodiments of the present invention, a compression force will preferably exist within the trench-joint as well as a tensile force. Thus, according to one or more of the embodiments of the present invention, the structural integrity of the MEMS device will be improved. This improvement of the structural integrity is preferably independent of the existence of voids or gaps that may occur in the trench-fill process of the present invention. Because the silicon itself is arranged into the interlocking geometric shape, if portions of the dielectric material were to fail, the silicon itself will preferably hold itself together with the compression forces of the particular interlocking geometric areas. Therefore, the present invention preferably improves the structural integrity even in the presence of voids in the trench fills.

The structural integrity of the trench-joints may be even further improved with the addition of condyles as disclosed in the Clark patent. FIG. 5 illustrates three trench joints similar in interlocking geometric trenches, as those depicted in FIG. 4. However, the trench joints of FIG. 5 include the addition of condyles, nubbins, or knuckles which improve the trench-fill process and reduce the probability of excessive voids or gaps in the trench-fill. Trench-fills 50a, 50b, and 50c each contain the interlocking geometries that provide the compressive forces but also include various arrangements of condyles in order to improve the trench-fill process.

It should be noted that the friction connectors previously described do not operate and are not fabricated in the same fashion as the present invention. In the connector technology, two separate and independent devices are fabricated. Those devices include the connectors that would allow the two separate devices to be joined. In the described embodiments of the present invention, the interlocking trench-joint is etched in situ, and then filled with the non-conducting material. Therefore, the devices are not intended to be separated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sub-millimeter device having mechanically rigid electrical isolation properties, said device comprising:

an isolation trench etched into a device layer, and separating the device layer into first and second substrate portions, wherein said isolation trench comprises an interlocking geometric pattern between said first and second substrate portions; and a non-conducting material filled into said isolation trench.

2. The sub-millimeter device of claim 1 further comprising:

one or more condyles etched along selected portions of said isolation trench.

3. The sub-millimeter device of claim 1 wherein said interlocking geometric pattern provides compression force on said non-conducting material along at least a portion of said isolation trench regardless of a direction from which an in plane external force is exerted on said sub-millimeter device.

4. The sub-millimeter of claim 1 wherein said non-conducting material is filled into said isolation trench using a low temperature process.

5. The sub-millimeter device of claim 1 wherein said interlocking geometric pattern in a plane of fabrication.

6. A trench element providing electrical isolation and mechanical stability to a microelectromechanical (MEM) device, said trench element comprising:

a channel etched through a device layer forming at least one dove-tailed joint between first and second substrate portions within said device layer, and a dielectric material filling said channel, wherein said trench element exerts compression force on said dielectric material along at least a portion of said channel when an external force is applied to said MEM device.

7. The trench element of claim 6 wherein said MEM device is constructed from a single crystal silicon (SCS) layer of a silicon on insulator (SOI) wafer.

8. The trench element of claim 6 further comprising:

at least one well etched along selected portions of said channel, wherein said well is wider than a width of said channel.

9. The trench element of claim 6 wherein said dielectric material is filled into said channel using 1ow-temperature processing.

10. A mechanically robust sub-millimeter device formed into a silicon substrate, the device comprising:

a first component of the silicon substrate having a first joint section;

a second component of the silicon substrate having a second joint section, wherein the second joint section is shaped to interlock the first joint section; and an electrical isolation trench filled with non-conducting material extending between the first and second joint sections.

11. The mechanically robust sub-millimeter device of claim 10 wherein the first and second joint sections interlock to form a dove-tail joint.

* * * * *